United States Patent
Price et al.

(10) Patent No.: US 12,302,016 B2
(45) Date of Patent: May 13, 2025

(54) IMAGE SENSING PIXEL CONFIGURATIONS FOR REDUCED SENSOR NOISE

(71) Applicant: Microsoft Technology Licensing, LLC, Redmond, WA (US)

(72) Inventors: Raymond Kirk Price, Carnation, WA (US); Michael Bleyer, Seattle, WA (US); Christopher Douglas Edmonds, Carnation, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/494,592

(22) Filed: Oct. 25, 2023

(65) Prior Publication Data

US 2024/0056696 A1 Feb. 15, 2024

Related U.S. Application Data

(63) Continuation of application No. 17/682,972, filed on Feb. 28, 2022, now Pat. No. 11,849,227.

(51) Int. Cl.
*H04N 25/671* (2023.01)
*G06T 5/70* (2024.01)

(52) U.S. Cl.
CPC .............. *H04N 25/671* (2023.01); *G06T 5/70* (2024.01)

(58) Field of Classification Search
CPC ... H04N 25/671; G06T 5/70; H01L 27/14609; H01L 27/1463; H01L 27/1464; H01L 27/14603
See application file for complete search history.

(56) References Cited

U.S. PATENT DOCUMENTS

2020/0388643 A1* 12/2020 Ma .................... H01L 27/14645
2021/0273120 A1* 9/2021 Zang ................. H01L 31/02327

* cited by examiner

*Primary Examiner* — Yogesh K Aggarwal
(74) *Attorney, Agent, or Firm* — Workman Nydegger

(57) ABSTRACT

An image sensor configured to capture imagery with mitigated noise includes a plurality of image sensing pixels arranged to form a sensor array. Each image sensing pixel of the plurality of image sensing pixels comprises an active area configured to receive photons to facilitate image capture. Each active area comprises a length and a width. For at least one image sensing pixel of the plurality of image sensing pixels, the length or the width of the active area is smaller than about 80% of a pixel pitch measurement between the at least one image sensing pixel and an adjacent image sensing pixel. A size of the active area relative to the pixel pitch measurement contributes to mitigating sensor noise for the image sensor.

18 Claims, 6 Drawing Sheets

600

602
Configuring An Image Sensor To Detect One Or More Photons Within A Low Light Environment 604
Generating A Noise-Mitigated Image Based Upon The One Or More Photons Detected By The Image Sensor

FIG. 6

IMAGE SENSING PIXEL CONFIGURATIONS FOR REDUCED SENSOR NOISE

CROSS-REFERENCE TO RELATED APPLICATIONS

This application is a continuation of U.S. patent application Ser. No. 17/682,972, filed on Feb. 28, 2022, and entitled "IMAGE SENSING PIXEL CONFIGURATIONS FOR REDUCED SENSOR NOISE", the entirety of which is incorporated herein by reference for all purposes.

BACKGROUND

Mixed-reality (MR) systems, including virtual-reality and augmented-reality systems, have received significant attention because of their ability to create truly unique experiences for their users. For reference, conventional virtual-reality (VR) systems create a completely immersive experience by restricting their users' views to only a virtual environment. This is often achieved, in VR systems, through the use of a head-mounted device (HMD) that completely blocks any view of the real world. As a result, a user is entirely immersed within the virtual environment. In contrast, conventional augmented-reality (AR) systems create an augmented-reality experience by visually presenting virtual objects that are placed in or that interact with the real world.

As used herein, VR and AR systems are described and referenced interchangeably. Unless stated otherwise, the descriptions herein apply equally to all types of mixed-reality systems, which (as detailed above) includes AR systems, VR reality systems, and/or any other similar system capable of displaying virtual objects.

Some MR systems include one or more cameras for facilitating image capture, video capture, and/or other functions. For instance, cameras of an MR system may utilize images and/or depth information obtained using the camera(s) to provide pass-through views of a user's environment to the user. An MR system may provide pass-through views in various ways. For example, an MR system may present raw images captured by the camera(s) of the MR system to a user. In other instances, an MR system may modify and/or reproject captured image data to correspond to the perspective of a user's eye to generate pass-through views. An MR system may modify and/or reproject captured image data to generate a pass-through view using depth information for the captured environment obtained by the MR system (e.g., using a depth system of the MR system, such as a time-of-flight camera, a rangefinder, stereoscopic depth cameras, etc.). In some instances, an MR system utilizes one or more predefined depth values to generate pass-through views (e.g., by performing planar reprojection).

In some instances, pass-through views generated by modifying and/or reprojecting captured image data may at least partially correct for differences in perspective brought about by the physical separation between a user's eyes and the camera(s) of the MR system (known as the "parallax problem," "parallax error," or, simply "parallax"). Such pass-through views/images may be referred to as "parallax-corrected pass-through" views/images. By way of illustration, parallax-corrected pass-through images may appear to a user as though they were captured by cameras that are co-located with the user's eyes.

A pass-through view can aid users in avoiding disorientation and/or safety hazards when transitioning into and/or navigating within a mixed-reality environment. Pass-through views may also enhance user views in low visibility environments. For example, mixed-reality systems configured with long wavelength thermal imaging cameras may facilitate visibility in smoke, haze, fog, and/or dust. Likewise, mixed-reality systems configured with low light imaging cameras facilitate visibility in dark environments where the ambient light level is below the level required for human vision.

To facilitate imaging of an environment for generating a pass-through view, some MR systems include image sensors that utilize complementary metal-oxide-semiconductor (CMOS) and/or charge-coupled device (CCD) technology. For example, such technologies may include image sensing pixel arrays where each pixel is configured to generate electron-hole pairs in response to detected photons. The electrons may become stored in per-pixel capacitors, and the charge stored in the capacitors may be read out to provide image data (e.g., by converting the stored charge to a voltage).

However, such image sensors suffer from a number of shortcomings. For example, the signal to noise ratio for a conventional image sensor may be highly affected by read noise, especially when imaging under low visibility conditions. For instance, under low light imaging conditions (e.g., where ambient light is below about 10 lux, such as within a range of about 1 millilux or below), imaging sensors may detect only a small number of photons, which may cause the read noise and/or fixed pattern noise to approach or exceed the signal detected by the imaging pixel and decrease the signal-to-noise ratio.

As read and fixed pattern noise are improved in some sensors, another source of noise, dark shot noise, becomes dominant. Dark shot noise can be thought of as the contribution due to dark current (also known as leakage current) in the pixel.

The dominance of read noise and/or fixed pattern noise in a signal detected by a CMOS or CCD image sensor is often exacerbated when imaging at a high frame rate under low light conditions. Although a lower framerate may be used to allow a CMOS or CCD sensor to detect enough photons to allow the signal to avoid being dominated by read noise, utilizing a low framerate often leads to motion blur in captured images. Motion blur is especially problematic when imaging is performed on an HMD or other device that undergoes regular motion during use.

In addition to affecting pass-through imaging, the read noise and/or motion blur associated with conventional image sensors may also affect other operations performed by HMDs, such as late stage reprojection, rolling shutter corrections, object tracking (e.g., hand tracking), surface reconstruction, semantic labeling, 3D reconstruction of objects, and/or others.

To address shortcomings associated with CMOS and/or CCD image sensors, devices have emerged that utilize single photon avalanche diode (SPAD) image sensors (and/or other low noise image sensors). A SPAD pixel is operated at a bias voltage that enables the SPAD to detect a single photon. Upon detecting a single photon, an electron-hole pair is formed, and the electron is accelerated across a high electric field, causing avalanche multiplication (e.g., generating additional electron-hole pairs). Thus, each detected photon may trigger an avalanche event. A SPAD may operate in a gated manner (each gate corresponding to a separate shutter operation), where each gated shutter operation may be configured detect an avalanche and to result in a binary output. The binary output may comprise a "1" where an avalanche event was detected during an exposure (e.g., where a photon was detected), or a "0" where no avalanche event was detected.

Separate shutter operations may be performed consecutively and integrated over a frame capture time period. The binary output of the consecutive shutter operations over a frame capture time period may be counted, and an intensity value may be calculated based on the counted binary output.

An array of SPADs may form an image sensor, with each SPAD forming a separate pixel in the SPAD array. To capture an image of an environment, each SPAD pixel may detect avalanche events and provide binary output for consecutive shutter operations in the manner described herein. The per-pixel binary output of consecutive shutter operations over a frame capture time period may be counted, and per-pixel intensity values may be calculated based on the counted per-pixel binary output. The per-pixel intensity values may be used to form an intensity image of an environment.

Although SPAD sensors show promise for overcoming various shortcomings associated with CMOS or CCD sensors, implementing SPAD sensors for image and/or video capture is still associated with many challenges. For example, there is an ongoing need and desire for improvements to the image quality of SPAD imagery, particularly for SPAD imagery captured under low light conditions. One of the main sources of noise in SPAD devices is dark shot noise. Reverse bias current, or leakage current, can also trigger avalanche events, and is one of the main contributors to noise in the system, and limits the ability to image in low ambient environments.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments include systems, methods, and devices for acquiring noise-mitigated imagery, such as by reducing dark shot noise to improve low light imaging performance.

Some embodiments provide an image sensor configured to capture imagery with mitigated noise. The image sensor includes a modification to a pixel design to mitigate dark shot noise in imaging sensors. A plurality of these modified image sensing pixels arranged to form a sensor array. Each image sensing pixel of the plurality of image sensing pixels comprises an active area configured to receive photons to facilitate image capture. Each active area comprises a length and a width. In some implementations, for at least one image sensing pixel of the plurality of image sensing pixels, the length or the width of the active area is smaller than about 80% of a pixel pitch measurement between the at least one image sensing pixel and an adjacent image sensing pixel. A size of the active area relative to the pixel pitch measurement may contribute to mitigating sensor noise for the image sensor.

Some embodiments provide an image sensor that includes a plurality of image sensing pixels arranged to form a sensor array. Each image sensing pixel of the plurality of image sensing pixels comprises an active area configured to receive photons to facilitate image capture. In some instances, each image sensing pixel of the plurality of image sensing pixels comprises a micro-lens configured to direct light toward the active area. Each active area comprises a length and a width. In some implementations, for at least one image sensing pixel of the plurality of image sensing pixels, the length or the width of the active area is smaller than about 80% of a diameter of the micro-lens. The size of the active area relative to the pixel pitch and/or associated diameter of the micro-lens may contribute to mitigating sensor noise for the image sensor.

Some embodiments provide a method for acquiring noise-mitigated imagery. The method comprises configuring an image sensor to detect one or more photons within a low light environment. The image sensor may comprise a plurality of image sensing pixels arranged to form a sensor array. Each image sensing pixel of the plurality of image sensing pixels may comprise an active area configured to receive photons to facilitate image capture. Each active area may comprise a length and a width. In some implementations, for each image sensing pixel of the plurality of image sensing pixels, the perimeter, as measured by the length or the width of the active area, is smaller than about 80% of a pixel perimeter measurement of the image sensor. The size of the active areas relative to the pixel pitch measurement may contribute to mitigating sensor noise for the image sensor. The method further comprises generating a noise-mitigated image based upon the one or more photons detected by the image sensor.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 6 illustrates an example flow diagram depicting acts associated with acquiring noise-mitigated imagery, in accordance with implementations of the present disclosure.

DETAILED DESCRIPTION

Figure 1:
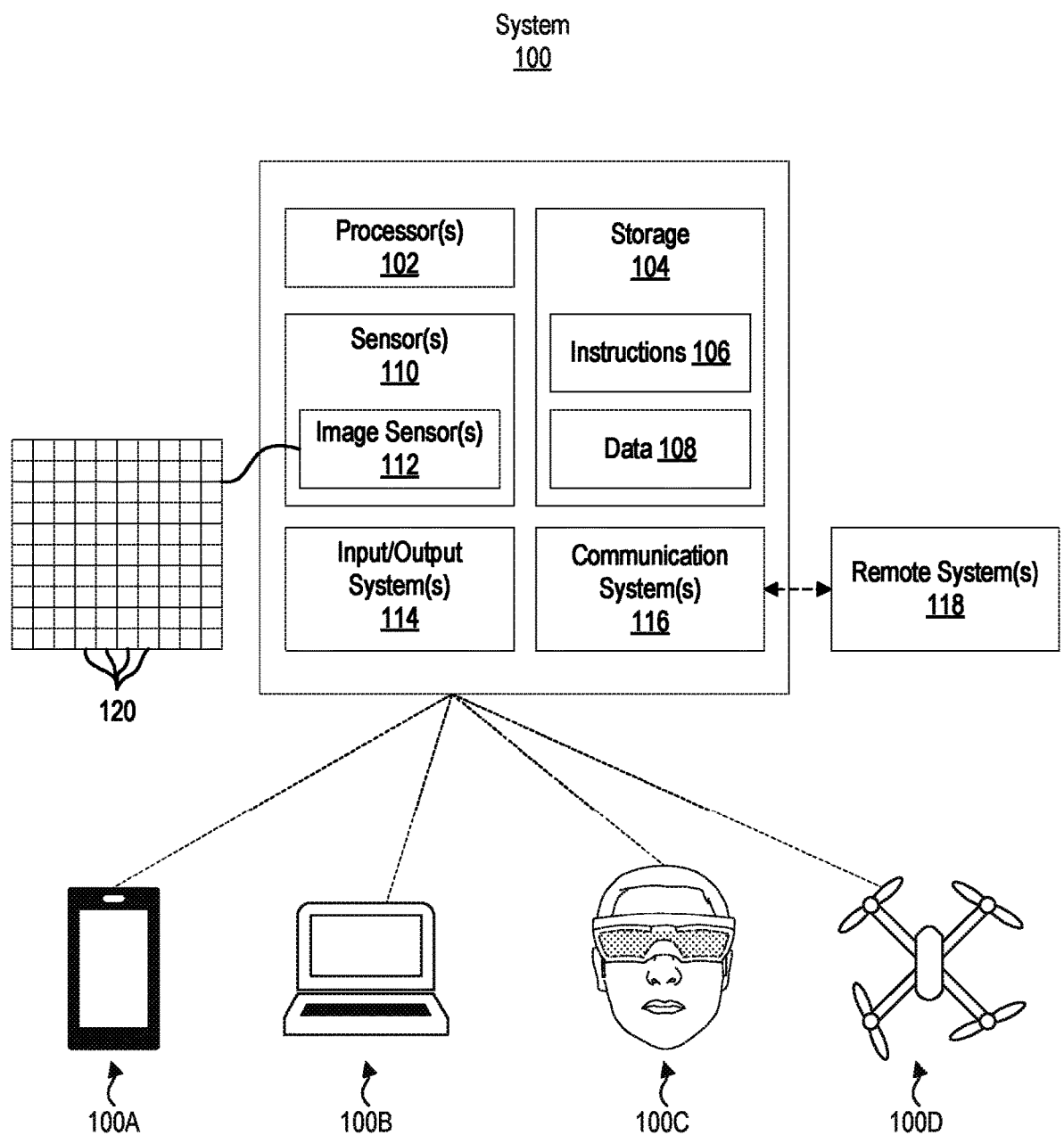
FIG. 1 illustrates example components of an example system that may include or be used to implement one or more disclosed embodiments.

Disclosed embodiments are generally directed to image sensing pixel configurations for reduced sensor noise, and systems, methods, and devices associated therewith.

Examples of Technical Benefits, Improvements, and Practical Applications

Those skilled in the art will recognize, in view of the present disclosure, that at least some of the disclosed embodiments may be implemented to address various shortcomings associated with at least some conventional imaging systems, particularly for imaging under low light conditions. The following section outlines some example improvements and/or practical applications provided by the disclosed embodiments. It will be appreciated, however, that the following are examples only and that the embodiments described herein are in no way limited to the example improvements discussed herein.

SPAD image sensors (and/or other low noise image sensors) are able to capture images with reduced read noise and row and column temporal noise (e.g., as compared to conventional CMOS or CCD image sensors). However, as noted above, there is an ongoing need and desire for improvements to the image quality of SPAD imagery (or other low noise sensor imagery), particularly for SPAD imagery captured under low light conditions.

For example, challenge associated with image acquisition using SPADs is signal noise brought about by dark current. Dark current (sometimes referred to as reverse bias leakage current) refers to a small electric current that flows through photosensitive devices (e.g., SPADs) even when no photons are entering the device. Dark current can be thermally induced or brought about by crystallographic and/or manufacturing irregularities and/or defects that may arise from silicon processing and that may remain even after annealing.

In SPADs, dark current can cause an electron-hole pair to be generated in the depletion region and can trigger avalanche events, even when the SPAD is not detecting a photon. Avalanche events brought about by dark current are typically counted as detected photons, which can cause the binary output of a SPAD to include false counts (or "dark counts"). In SPAD imagery, dark counts can cause the intensity values assigned to at least some SPAD pixels to by inaccurately high, which can add dark shot noise (e.g., random spatio-temporal noise) to SPAD imagery. In some instances, the effects of dark counts are prominent when imaging under low light conditions, contributing to high fixed pattern noise that degrades user experiences. These pixels or groups of pixels, also known as hot clusters, are regions with higher dark current (also referred to as "dark counts") than adjacent pixels.

Various techniques exist for compensating for dark shot noise in SPAD imagery includes. Such techniques include obtaining a dark current image that indicates which SPAD pixels of a SPAD array generate dark counts and/or the quantity of dark counts generated by different SPAD pixels. A dark current image may be obtained during a calibration operation or based on imagery captured at runtime. The dark current image can be used at runtime to modify images captured using the SPAD array to compensate for dark counts, such as by performing a subtraction operation that subtracts the dark current image from the captured SPAD imagery.

However, even when existing dark current compensation operations are implemented, at least some dark shot noise may persist in SPAD imagery (predominantly caused by surface defects that arise from silicon processing). Thus, at least some embodiments of the present disclosure provide improved image sensor pixel configurations for enabling capture of noise-mitigated imagery (e.g., with reduced dark shot noise).

Many conventional image sensors adapted for capturing images under low light conditions (e.g., where ambient light is below about 10 lux, such as within a range of about 1 millilux or below) use relatively large pixels (i.e. pixels with a pixel pitch in the 6 to 16 um range) and seek to maximize the size of the active areas of the sensor pixels in an attempt to enable the sensor pixels to capture all possible photons to generate output imagery. An active area of an image sensor pixel comprises the optical input portion of the image sensing pixel (which may reside beneath the micro-lens for the pixel) through which photons may pass to reach other pixel components for detecting and/or quantifying input light to facilitate image capture. Many conventional low light image sensors additionally or alternatively attempt to maximize well depth (e.g., active region depth beneath the active area) and/or minimize the size of sensor electronics and/or metallization to provide for increased well capacity for counting photons and/or to increase quantum efficiency.

Counter-intuitively, and unexpectedly, it has been found that although reducing the active area of the image sensing pixels reduces the area through which photons may pass to reach other light-detection pixel components, the reduction in the active area also reduces the amount of dark shot noise present in captured imagery (e.g., by reducing the surface area in which defects may be present), amounting to a net improvement in captured image quality (e.g., particularly when imaging under low light conditions). It has also been found, unexpectedly, that reducing the depth of the active region (e.g., beneath the active area) contributes to reduced dark count noise.

Accordingly, in contrast with conventional approaches for improving low-light imagery, embodiments of the present disclosure are directed to image sensors that include pixels with a reduced active area and/or with a reduced active region depth (e.g., beneath the active area). Image sensors implementing the disclosed principles may capture noise-mitigated imagery, especially when imaging under low light conditions.

Although the present disclosure focuses, in at least some respects, on examples that include SPAD sensors (e.g., SPAD sensor(s) implemented on an HMD), the principles disclosed herein may be applied to images captured using other types of image sensors (e.g., other low-noise image sensors, and/or CMOS or CCD image sensors).

Having just described some of the various high-level features and benefits of the disclosed embodiments, attention will now be directed to FIGS. 1 through 6. These Figures illustrate various conceptual representations, architectures, methods, and supporting illustrations related to the disclosed embodiments.

Example Systems, Components, and Image Sensor Pixel Configurations for Reduced Sensor Noise FIG. 1 illustrates various example components of a system 100 that may be used to implement one or more disclosed embodiments. For example, FIG. 1 illustrates that a system 100 may include processor(s) 102, storage 104, sensor(s) 110, image sensor(s) 112, input/output system(s) 114 (I/O system(s) 114), and communication system(s) 116. Although FIG. 1 illustrates a system 100 as including particular components, one will appreciate, in view of the present disclosure, that a system 100 may comprise any number of additional or alternative components.

The processor(s) 102 may comprise one or more sets of electronic circuitry that include any number of logic units, registers, and/or control units to facilitate the execution of computer-readable instructions (e.g., instructions that form a computer program). Such computer-readable instructions may be stored within storage 104. The storage 104 may comprise physical system memory and may be volatile, non-volatile, or some combination thereof. Furthermore, storage 104 may comprise local storage, remote storage (e.g., accessible via communication system(s) 116 or otherwise), or some combination thereof. Additional details related to processors (e.g., processor(s) 102) and computer storage media (e.g., storage 104) will be provided hereinafter.

In some implementations, the processor(s) 102 may comprise or be configurable to execute any combination of software and/or hardware components that are operable to facilitate processing using machine learning models or other artificial intelligence-based structures/architectures. For example, processor(s) 102 may comprise and/or utilize hardware components or computer-executable instructions operable to carry out function blocks and/or processing layers configured in the form of, by way of non-limiting example, single-layer neural networks, feed forward neural networks, radial basis function networks, deep feed-forward networks, recurrent neural networks, long-short term memory (LSTM) networks, gated recurrent units, autoencoder neural networks, variational autoencoders, denoising autoencoders, sparse autoencoders, Markov chains, Hopfield neural networks, Boltzmann machine networks, restricted Boltzmann machine networks, deep belief networks, deep convolutional networks (or convolutional neural networks), deconvolutional neural networks, deep convolutional inverse graphics networks, generative adversarial networks, liquid state machines, extreme learning machines, echo state networks, deep residual networks, Kohonen networks, support vector machines, neural Turing machines, and/or others.

As will be described in more detail, the processor(s) 102 may be configured to execute instructions 106 stored within storage 104 to perform certain actions associated with noise-mitigated image capture. The actions may rely at least in part on data 108 stored on storage 104 in a volatile or non-volatile manner.

In some instances, the actions may rely at least in part on communication system(s) 116 for receiving data from remote system(s) 118, which may include, for example, separate systems or computing devices, sensors, and/or others. The communications system(s) 118 may comprise any combination of software or hardware components that are operable to facilitate communication between on-system components/devices and/or with off-system components/devices. For example, the communications system(s) 118 may comprise ports, buses, or other physical connection apparatuses for communicating with other devices/components. Additionally, or alternatively, the communications system(s) 118 may comprise systems/components operable to communicate wirelessly with external systems and/or devices through any suitable communication channel(s), such as, by way of non-limiting example, Bluetooth, ultra-wideband, WLAN, infrared communication, and/or others.

FIG. 1 illustrates that a system 100 may comprise or be in communication with sensor(s) 110. Sensor(s) 110 may comprise any device for capturing or measuring data representative of perceivable or detectable phenomenon. By way of non-limiting example, the sensor(s) 110 may comprise one or more image sensors, microphones, thermometers, barometers, magnetometers, accelerometers, gyroscopes, and/or others.

FIG. 1 also illustrates that the sensor(s) 110 may include image sensor(s) 112. As depicted in FIG. 1, image sensor(s) 112 may comprise an arrangement of image sensing pixels 120 that form a sensor array and are each configured to detect photons to facilitate image capture. For instance, where the image sensor(s) 112 comprise one or more SPAD sensors, the image sensing pixels 120 may facilitate avalanche events in response to sensing a photon, as described hereinabove. After detecting a photon, the image sensing pixels 120 may be recharged to prepare the image sensing pixels 120 for detecting additional avalanche events. Image sensor(s) 112 may be implemented on a system 100 (e.g., an MR HMD) to facilitate various functions such as, by way of non-limiting example, image capture and/or computer vision tasks.

Furthermore, FIG. 1 illustrates that a system 100 may comprise or be in communication with I/O system(s) 114. I/O system(s) 114 may include any type of input or output device such as, by way of non-limiting example, a touch screen, a mouse, a keyboard, a controller, and/or others, without limitation. For example, the I/O system(s) 114 may include a display system that may comprise any number of display panels, optics, laser scanning display assemblies, and/or other components.

FIG. 1 conceptually represents that the components of the system 100 may comprise or utilize various types of devices, such as mobile electronic device 100A (e.g., a smartphone), personal computing device 100B (e.g., a laptop), a mixed-reality head-mounted display 100C (HMD 100C), an aerial vehicle 100D (e.g., a drone), and/or other devices. Although the present description focuses, in at least some respects, on utilizing an HMD to implement techniques of the present disclosure, additional or alternative types of systems may be used.

Figure 2:
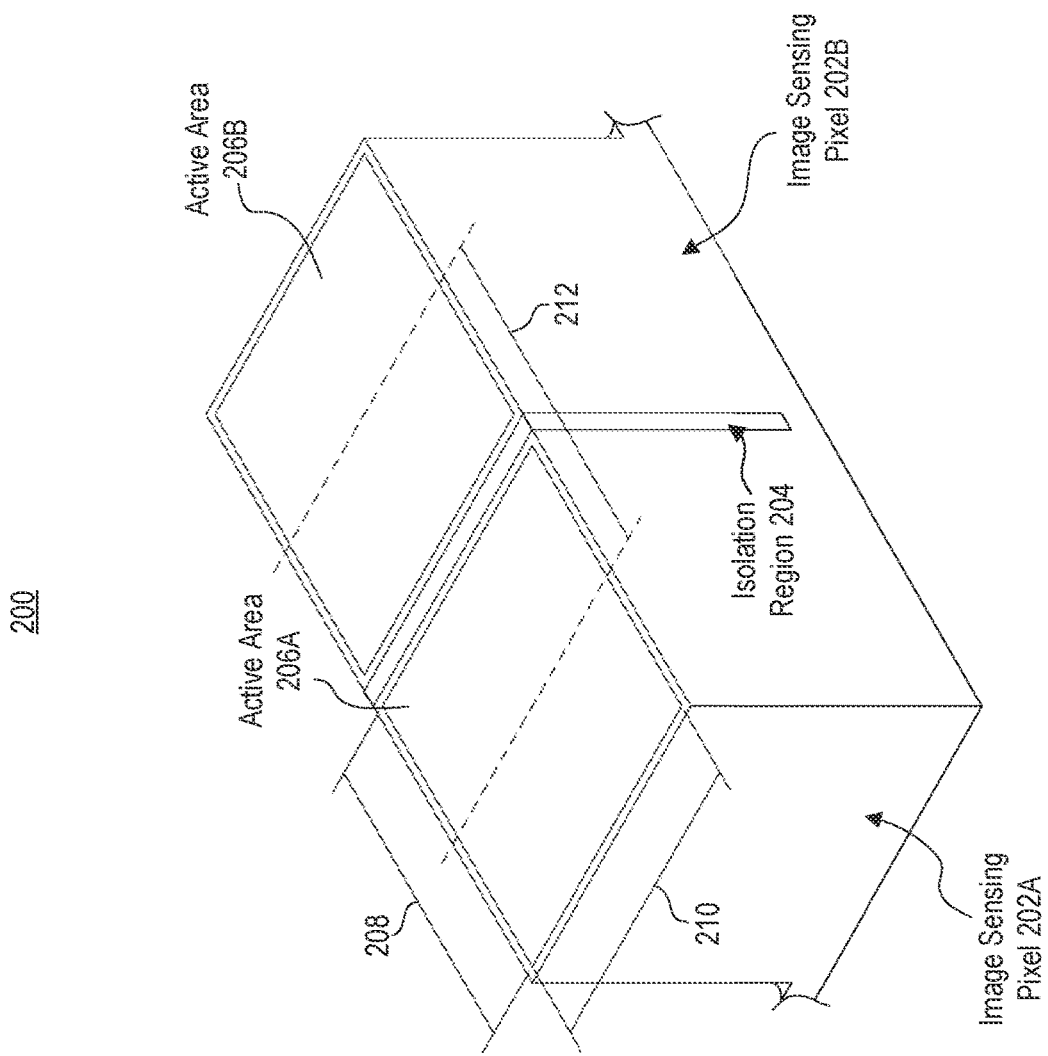
FIG. 2 illustrates an example of image sensing pixels of a conventional low light image sensor.

As noted above, at least some embodiments of the present disclosure implement image sensing pixels with reduced active areas and/or active regions to enable noise-mitigated image capture (e.g., particularly when imaging under low light conditions). By way of comparison, FIG. 2 illustrates image sensing pixels 202A and 202B of a conventional image sensor 200 for low light imaging. The image sensing pixels 202A and 202B are separated by deep trench isolation, as indicated in FIG. 2 by the illustrated isolation region 204. The break lines bounding the image sensing pixels 202A and 202B indicate that the conventional image sensor 200 may comprise any number of image sensing pixels to form a sensor array.

FIG. 2 illustrates the active areas 206A and 206B of the image sensing pixels 202A and 202B, respectively. As noted above, the active areas 206A and 206B may comprise the optical input regions of the image sensing pixels 202A and 202B, through which photons may pass to reach other pixel components for facilitating image generation (e.g., photo-induced charge collection, photo-induced avalanche multiplication, etc.).

FIG. 2 illustrates the length 208 and the width 210 of the active area 206A of image sensing pixel 202A of the conventional image sensor 200. FIG. 2 also shows a pixel pitch measurement 212, which comprises a center-to-center distance between the image sensing pixels 202A and 202B. As noted above, and as reflected in FIG. 2, the length 208 and the width 210 of the active area 206A of image sensing pixel 202A approach the pixel pitch measurement 212 in an attempt to maximize the active area 206A to allow the image sensing pixel 202A to capture all available photons during image capture (particularly when imaging under low light conditions).

In contrast with the conventional image sensor 200 shown in FIG. 2, image sensors of the present disclosure comprise a reduced active area (e.g., relative to pixel pitch and/or other measurements), which contributes to mitigating sensor noise (e.g., dark shot noise) present in captured imagery.

Figure 3:
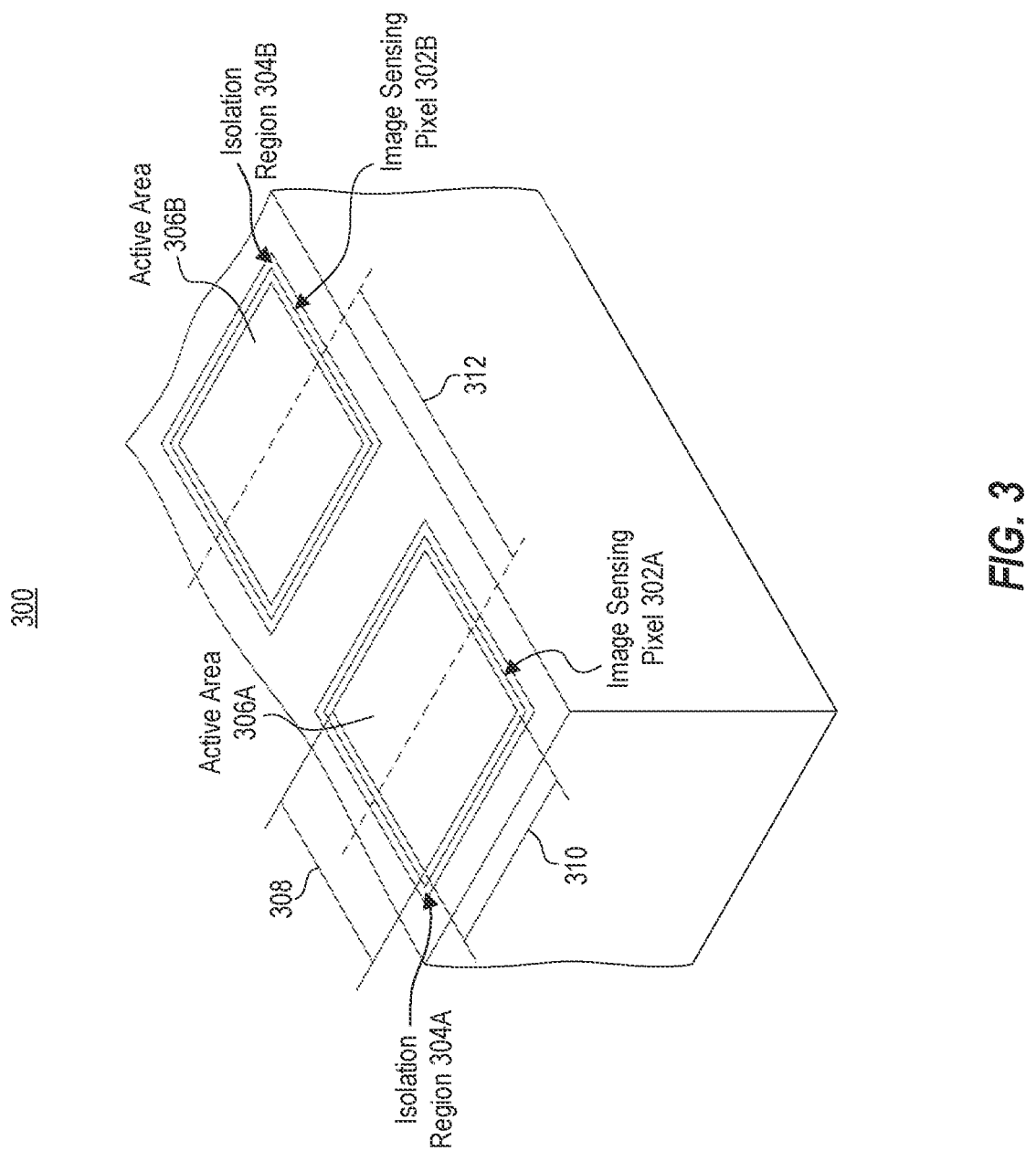
FIG. 3 illustrates a perspective view of an example of image sensing pixels of an image sensor that comprise reduced active areas, in accordance with implementations of the present disclosure.

FIG. 3 illustrates a perspective view of an example of image sensing pixels 302A and 302B of an image sensor 300 that is configured to capture imagery with mitigated noise. The image sensor 300 may comprise a SPAD sensor or other type of image sensor, and the image sensing pixels 302A and 302B shown in FIG. 3 may be arranged along the same row or the same column of the image sensor 300. The curved break lines bounding image sensing pixels 302A and 302B indicate that the image sensor 300 may comprise any number of image sensing pixels to form a sensor array. In the example of FIG. 3, the image sensing pixels 302A and 302B of the image sensor 300 are each bounded by a respective isolation region (isolation region 304A for image sensing pixel 302A and isolation region 304B for image sensing pixel 302B). The isolation regions 304A and 304B may provide optical and/or electrical isolation (e.g., deep trench isolation) between adjacent image sensing pixels. In some instances, the isolation region(s) are filled (e.g., with dielectric and/or metal materials.

FIG. 3 furthermore illustrates that the image sensing pixels 302A and 302B of the image sensor 300 each comprise an active area (active area 306A for image sensing pixel 302A and active area 306B for image sensing pixel 302B). As noted above, the active areas 306A and 306B may comprise optically active input regions for the image sensing pixels 302A and 302B, respectively, and may comprise an outer, scene-facing portion of the image sensing pixels 302A and 302B through which photons may pass to reach photoactive components of the image sensing pixels 302A and 302B (e.g., photodiodes, potential wells, absorption regions, etc.). The active areas 306A and 306B may be bounded by the respective isolation regions 304A and 304B and/or other boundaries associated with the image sensing pixels (e.g., metallization, sensor electronics, etc.).

FIG. 3 illustrates the length 308 and the width 310 of the active area 306A of image sensing pixel 302A. FIG. 3 also illustrates a pixel pitch measurement 312 (e.g., center-to-center measurement) between the image sensing pixels 302A and 302B. In contrast with the length 208 and the width 210 of the active area 206A of the image sensing pixel 202A of the conventional image sensor 200 shown in FIG. 2 (which were designed to approach the pixel pitch measurement 212 to maximize the active area 206A for photon detection), the length 308 and the width 310 of the active area 306A of image sensing pixel 302A are intentionally, and counter-intuitively, selected to be less than the pixel pitch measurement 312, thereby reducing the active area 306A.

For instance, the length 308 and/or the width 310 of the active area 306A may be smaller than about 80% of the pixel pitch measurement 312 (or smaller than about 75%, 70%, 65%, 60%, 55%, 50, 40%, or 30% of the pixel pitch measurement 312). It has been found that implementing image sensing pixel active areas that are smaller than about 80% of the pixel pitch measurement of an image sensor allows the image sensor to be large enough to be suitable for low light imaging while still providing a sufficiently small active surface area to effectuate a perceptible reduction in dark shot noise present in imagery captured using the image sensor. As used herein, the term "about" is defined as including a range from 5% less than the indicated value to 5% larger than the indicated value.

By way of illustrative example, the pixel pitch measurement 312 of the image sensor 300 may comprise a length of about 6.4 μm, which may match the pixel pitch measurement 212 of the conventional image sensor 200. The length 208 and/or the width 210 of the active area 206A of the image sensing pixel 202A of the conventional image sensor 200 may be greater than about 90% of the pixel pitch measurement 212, such as 6.3 μm. In contrast, the length 308 and/or the width 310 of the active area 306A of the image sensing pixel 302A of the image sensor 300 may be lower than about 80% of the pixel pitch measurement 312, such as about 4 μm (e.g., about 60% of the pixel pitch measurement).

Continuing with the above example, when both the length 308 and the width 310 of the active area 306A are reduced to about 60% of the pixel pitch measurement 312 (e.g., 4 μm for the length 308 and/or the width 310 compared to a 6.39 μm pixel pitch measurement 312), the perimeter of the active area 306A may similarly be reduced to about 60% of the total perimeter of the image sensing pixel 302A (e.g., where the pixel perimeter lines follow midpoints between the centers of adjacent pixels or follow the outer edge of the image sensor for boundary pixels; pixel perimeter lines may be the same size as the pixel pitch measurement 312). The reduced perimeter of the active area 306A may contribute to a corresponding reduction in the area of the active area 306A compared to the total pixel area (e.g., an active area 306A of about 16 μm², compared to a total pixel area of about 40.8 μm², resulting in an active area 306A that is about 40% of the total pixel area).

As noted above, the reduced active area 306A may advantageously contribute to reduced dark shot noise in imagery captured by the image sensor 300 (e.g., by reducing the amount of surface area on which surface defects may reside).

Although the example of FIG. 3 shows both the length 308 and the width 310 of the active area 306A being less than about 80% of the pixel pitch measurement 312, embodiments where only the length 308 or only the width 310 is less than about 80% of the pixel pitch measurement 312 are within the scope of the present disclosure. One will also appreciate, in view of the present disclosure, that any number of image sensing pixels of the image sensor 300 may comprise an active area with a length and/or width that is less than about 80% of the pixel pitch measurement. Furthermore, the shape of the active areas shown in FIG. 3 are not limiting of the present disclosure, and other shapes may be used (e.g., circular active areas, active areas of other polygonal shapes, etc.).

Figure 4:
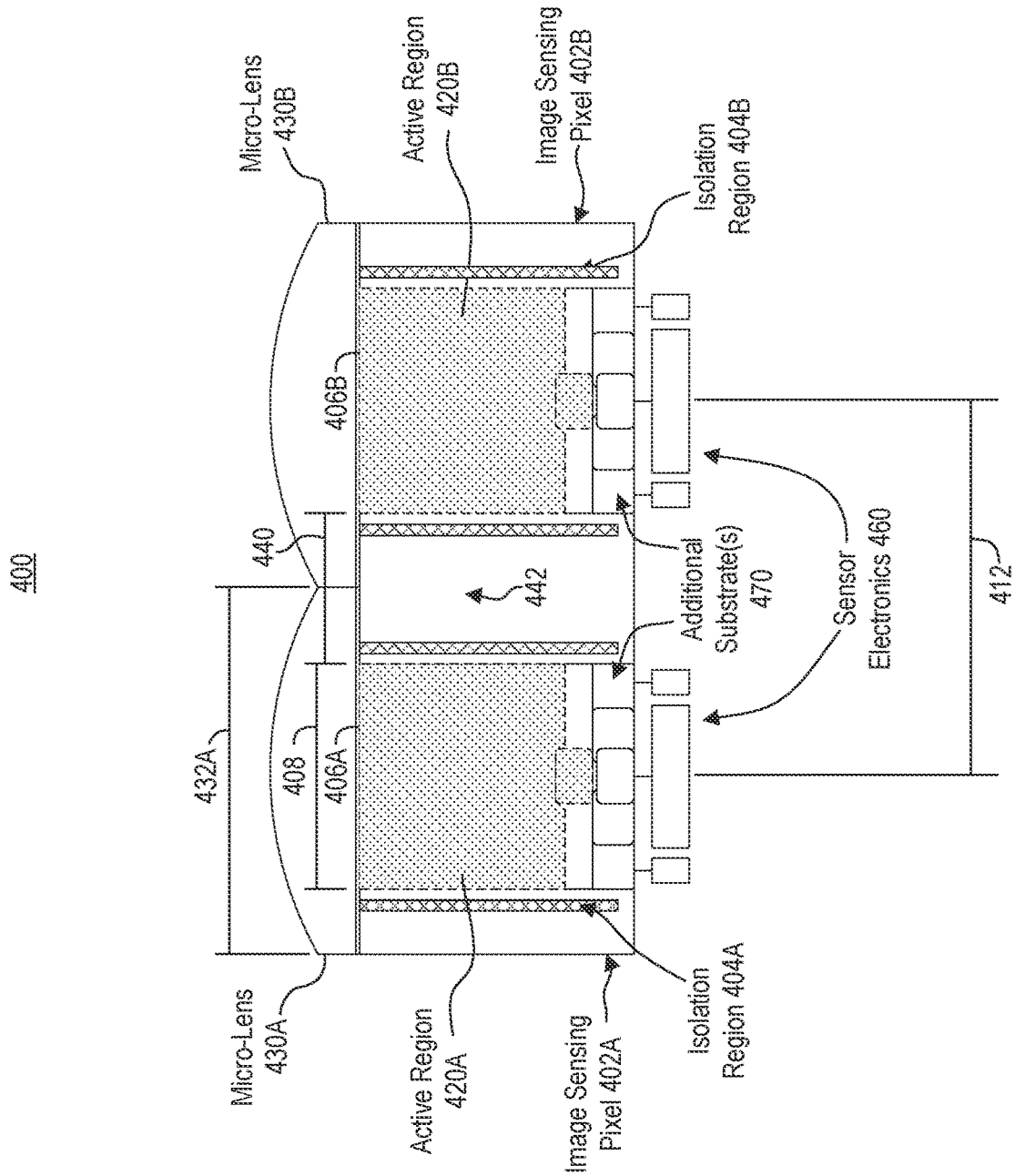
FIG. 4 illustrates a cross-sectional side view of example components of a charge focused single photon avalanche detector image sensing pixels of an image sensor that comprise reduced active areas, in accordance with implementations of the present disclosure.

FIG. 4 illustrates a cross-sectional side view of example components of image sensing pixels 402A and 402B of an image sensor 400 that comprise reduced active areas, similar to the image sensor 300 of FIG. 3. The image sensor 400 may similarly comprise a SPAD sensor comprising any number of image sensing pixels (where FIG. 4 only illustrates two adjacent pixels thereof).

FIG. 4 illustrates micro-lenses 430A and 430B arranged over the active areas 406A and 406B of the image sensing pixels 402A and 402B, respectively. The micro-lenses 430A and 430B are configured to direct environment light toward the active areas 406A and 406B to allow photons from the environment to reach the internal components of the image sensing pixels 402A and 402B.

FIG. 4 shows that the micro-lenses 430A and 430B abutting one another at the interface between the image sensing pixels 402A and 402B, allowing the micro-lenses 430A and 430B to direct as much environment light as possible toward the active areas 406A and 406B of the image sensing pixels 402A and 402B, respectively. Accordingly, FIG. 4 shows that the diameter 432A of the micro-lens 430A of image sensing pixel 402A is substantially similar to the length (and/or width) of the image sensing pixel 402A itself.

FIG. 4 illustrates the length 408 (and/or width) of the active area 406A of image sensing pixel 402A, which is selected to be less than the diameter 432A of the micro-lens 430A. For example, the length 408 (and/or width) of the active area 406A may be less than about 80% of the diameter 432A of the micro-lens 430A (e.g., the length 408 or width of the active area 406A may be about 60% of the diameter 432A). In some instances, the length 408 (and/or width) of the active area 406A is less than about 75%, 70%, 65%, 60%, 55%, or 50% of the diameter 432A of the micro-lens 430A. It has been found that implementing image sensing pixel active areas that are smaller than about 80% of the corresponding micro-lens diameter allows the micro-lenses of an image sensor to be large enough to be suitable for low light imaging while still providing a sufficiently small active surface area of the image sensor to effectuate a perceptible reduction in dark shot noise present in imagery captured using the image sensor. Notwithstanding the disparity in the length, width, perimeter, and/or area of the active area 406A relative to the micro-lens 430A, the micro-lenses 430A and 430B may be manufactured to refract incident light toward the active area 406A. Thus, the micro-lenses of the image sensor 400 may allow the image sensor to capture all available environment light for image acquisition, even where the active areas of the image sensor 400 smaller than the areas of the micro-lenses.

FIG. 4 illustrates additional components of the image sensing pixels 402A and 402B of the image sensor 400, which may be situated within the volume of the image sensing pixels 402A and 402B. Such components may be positioned below the scene-facing portion/surface of the image sensing pixels 402A and 402B (e.g., below the optical input regions or active areas 406A and 406B) and/or bounded by the isolation regions 404A and 404B of the image sensing pixels 402A and 402B. For example, FIG. 4 illustrates that the image sensing pixels 402A and 402B each include an active region 420A and 420B, respectively. The active regions 420A and 420B may comprise photoactive regions that are configured to receive photons to facilitate image capture. For example, for SPAD sensors, the active regions 420A and 420B may comprise absorption regions (e.g., where electron-hole pairs may be photogenerated; denoted by the large dashed rectangles) and/or multiplication regions (e.g., high electric field regions where avalanche multiplication may occur responsive to photo-generated electron-hole pairs; denoted by the small dashed rectangles centered at the bottom of the large dashed rectangles). For CMOS and/or CCD sensors, the active regions 420A and 420B may comprise photodiodes and/or potential wells. The active regions may include or be positioned beneath one or more surface layers (e.g., anti-reflective layers), buffer layers, or other substrates.

FIG. 4 illustrates additional substrate(s) 470 of the image sensing pixels 402A and 402B. By way of non-limiting example, for SPAD sensors, the additional substrate(s) 470 may comprise charge layers, grading layers, buffer layers, depletion zones, potential wells, and/or others. Such additional substrate(s) 470 may be formed utilizing undoped (i-type) and/or doped substrates (e.g., p-type or n-type). Although FIG. 4 illustrates the additional substrate(s) 470 as positioned beneath the active regions 420A and 420B, the additional substrate(s) 470 may be positioned anywhere within the image sensing pixels 402A and 402B relative to the active regions 420A and 420B (e.g., above, next to, and/or beneath). In some implementations, one or more of the additional substrate(s) 470 may be regarded as part of the active regions 420A and/or 420B.

FIG. 4 furthermore illustrates sensor electronics 460, which may comprise readout, row/column selection, reset/quench, and/or other circuitries for facilitating image capture utilizing the image sensing pixels 402A and 402B of the image sensor 400.

FIG. 4 illustrates a distance 440 between the active region 420A of image sensing pixel 402A and the active region 420B of image sensing pixel 402B. The distance 440 may comprise a shortest distance between the active regions 420A and 420B, being orthogonal to sidewalls of the active regions 420A and 420B (and/or orthogonal to sidewalls of the isolation regions 404A and 404B). As illustrated in FIG. 4, the distance 440 is appreciable relative to the pixel pitch measurement 412 (and/or the diameter 432A of the micro-lens 430A). For example, in some implementations, the distance 440 is greater than about 20% of the pixel pitch measurement 412 (or greater than about 25%, 30%, 35%, 40%, 45%, or 50% of the pixel pitch measurement 412). The distance 440 between the active regions 420A and 420B (or between active areas 406A and 406B) contributes to the reduced size of the active areas 406A and 406B and therefore contributes to reduced sensor noise (e.g., dark shot noise). It has been found that implementing distances between active areas that are greater than about 20% of the pixel pitch measurement of an image sensor allows the image sensor to be large enough to be suitable for low light imaging while still providing a sufficiently small active surface area to effectuate a perceptible reduction in dark shot noise present in imagery captured using the image sensor.

In some instances, other distances between components of the image sensing pixels 402A and 402B may be characterized as greater than 20% of the pixel pitch measurement 412, such as a distance between one or more aspects of the isolation regions 404A and 404B (e.g., between one or more nearest walls or trenches of the isolation regions 404A and 404B). Furthermore, as is evident from FIG. 4, the image sensor 400 may be characterized as having multiple isolation trenches between adjacent active areas/regions. The image sensor 400 may, in some instances, be characterized as comprising an unused region or dead space between adjacent active areas/regions (e.g., indicated in FIG. 4 by unused region 442). Such features may allow the image sensor to be large enough to be suitable for low light imaging while still providing a sufficiently small active surface area to effectuate a perceptible reduction in dark shot noise present in imagery captured using the image sensor.

Figure 5:
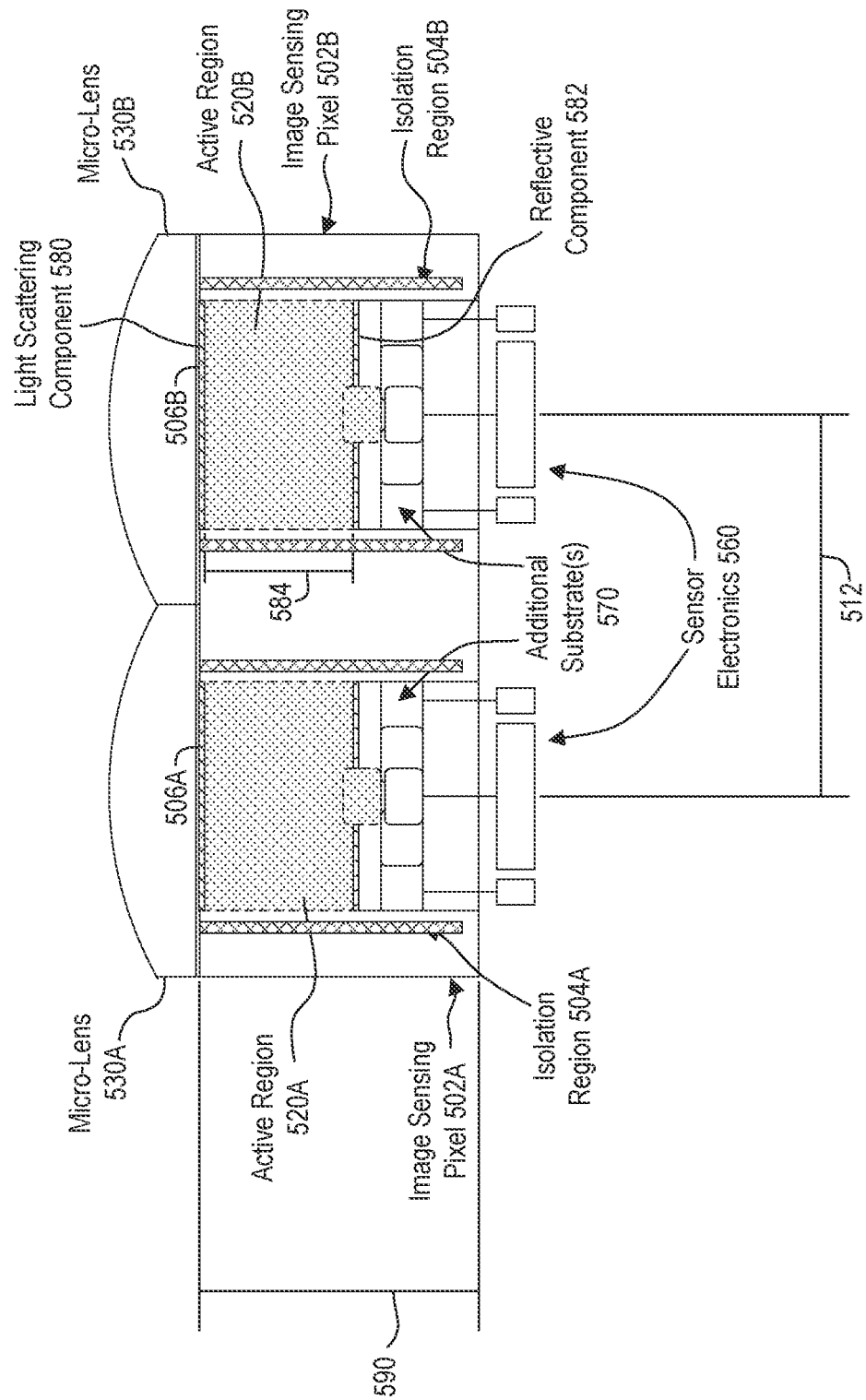
FIG. 5 illustrates a cross-sectional side view of example components of image sensing pixels of an image sensor that comprises a reduced active region depth, in accordance with implementations of the present disclosure.

As noted above, in some instances, the depth of the active regions of an image sensor are reduced to effectuate a reduction in dark shot noise. FIG. 5 illustrates a cross-sectional side view of example components of image sensing pixels 502A and 502B of an image sensor 500 that comprises reduced active region depths. The image sensing pixels 502A and 502B comprise components similar to those of the image sensing pixels 402A and 402B of the image sensor 400, such as micro-lenses 530A and 530B, active areas 506A and 506B, active regions 520A and 520B isolation regions 504A and 504B, additional substrate(s) 570, and sensor electronics 560.

FIG. 5 also illustrates a depth 584 of the active region 520B of image sensing pixel 502B. The depth may extend from a top portion of the active region 520B (e.g., a scene-facing portion, or a portion abutting scene-facing elements such as coatings and/or buffer substrates) to a bottom portion of the active region 520B (e.g., to a lower edge of an absorption region, multiplication region, potential well, photodiode, and/or other photoactive component(s)).

As is evident in FIG. 5, the depth 584 of the active region 520B is smaller than the pixel pitch measurement 512 and the trench depth of the isolation region 504B. For example, in some instances, the depth 584 of the active region 520B is less than about 80% of the pixel pitch measurement 512 (or the trench depth of the isolation region 504B, or the total pixel/silicon height 590). In some implementations, the depth 584 of the active region 520B is less than about 75%, less than about 70%, less than about 65%, less than about 60%, less than about 55%, or less than about 50% of the pixel pitch measurement 512 (or the trench depth of the isolation region 504B, or the total pixel/silicon height 590). As noted above, the reduced depth of the active region may contribute to reduced dark shot noise in imagery captured using the image sensor 500 (e.g., particularly for low light images), and it has been found that implementing active region depths that are less than about 80% of the pixel pitch measurement of an image sensor allow the image sensor to be large enough to be suitable for low light imaging while still effectuating a perceptible reduction in dark shot noise present in imagery captured using the image sensor. In some instances, the depth 584 of the active region 520B is within a range of about 4 μm to about 6 μm.

In some implementations, the image sensing pixels of the image sensor 500 include one or more components configured to extend the optical patch length of incident photons within the active regions of the image sensing pixels (e.g., to increase the probability of photon absorption). For example, as shown in FIG. 5, the image sensing pixel 502B includes a light scattering component 580, which may be implemented as surface roughening on the top or scene-facing portion of the active region 520B that alters the path of incident light within the active region 520B.

As another example, as illustrated in FIG. 5, the image sensing pixel 502B includes a reflective component 582, which may be implemented as a mirror or other component coated with a reflective material on the bottom portion (opposite the scene-facing top portion, above and/or abutting the sensor electronics 560 and/or additional substrate(s) 570) of the active region 520B to allow incident photons to continue to propagate through the active region 520B after entry therein. In some instances, one or more reflective components are additionally or alternatively placed on one or more sidewalls of the active region 520B. The reflective component(s) may increase the probability of photon absorption.

Example Method(s) for Acquiring Noise-Mitigated Imagery

The following discussion now refers to a number of methods and method acts that may be performed in accordance with the present disclosure. Although the method acts are discussed in a certain order and illustrated in a flow chart as occurring in a particular order, no particular ordering is required unless specifically stated, or required because an act is dependent on another act being completed prior to the act being performed. One will appreciate that certain embodiments of the present disclosure may omit one or more of the acts described herein.

FIG. 6 illustrates an example flow diagram 600 depicting acts associated with acquiring noise-mitigated imagery. The discussion of the various acts represented in flow diagram 600 include references to various hardware components described in more detail with reference to FIG. 1.

Act 602 of flow diagram 600 includes configuring an image sensor to detect one or more photons within a low light environment. Act 602 is performed, in some instances, utilizing one or more components of a system 100 (e.g., processor(s) 102, storage 104, sensor(s) 110, image sensor(s) 112), I/O system(s) 114, communication system(s) 116) and/or other components. The image sensor may comprise a plurality of image sensing pixels arranged to form a sensor array. In some implementations, each image sensing pixel of the plurality of image sensing pixels comprises an active area configured to receive photons to facilitate image capture. Each active area comprises a length and a width. In some instances, for each image sensing pixel of the plurality of image sensing pixels, the length or the width of the active area is smaller than about 80% of a pixel pitch measurement of the image sensor. In some instances, the length and/or the width of the active area is smaller than about 80% of the diameter of one or more micro-lenses associated with the plurality of image sensing pixels. In some instances, the distance between active regions of adjacent image sensing pixels is greater than about 20% of the pixel pitch measurement.

Act 604 of flow diagram 600 includes generating a noise-mitigated image based upon the one or more photons detected by the image sensor. Act 604 is performed, in some instances, utilizing one or more components of a system 100 (e.g., processor(s) 102, storage 104, sensor(s) 110, image sensor(s) 112), I/O system(s) 114, communication system(s) 116) and/or other components. The size of the active areas of the image sensor relative to the pixel pitch measurement of the image sensor contributes to mitigating sensor noise for the image sensor. In some implementations, generating the noise-mitigated image includes configuring each image sensing pixel of the image sensor to detect avalanche events based upon the one or more photons and provide binary output for consecutive shutter operations. The per-pixel binary output of consecutive shutter operations over a frame capture time period may be counted, and per-pixel intensity values may be calculated based on the counted per-pixel binary output. The per-pixel intensity values may be used to form generate the noise-mitigated image of an environment.

Additional Details Related to Computing Systems

Disclosed embodiments may comprise or utilize a special purpose or general-purpose computer including computer hardware, as discussed in greater detail below. Disclosed embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are one or more "physical computer storage media" or "hardware storage device(s)." Computer-readable media that merely carry computer-executable instructions without storing the computer-executable instructions are "transmission media." Thus, by way of example and not limitation, the current embodiments can comprise at least two distinctly different kinds of computer-readable media: computer storage media and transmission media.

Computer storage media (aka "hardware storage device") are computer-readable hardware storage devices, such as RAM, ROM, EEPROM, CD-ROM, solid state drives ("SSD") that are based on RAM, Flash memory, phase-change memory ("PCM"), or other types of memory, or other optical disk storage, magnetic disk storage or other magnetic storage devices, or any other medium that can be used to store desired program code means in hardware in the form of computer-executable instructions, data, or data structures and that can be accessed by a general-purpose or special-purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links which can be used to carry program code in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Disclosed embodiments may comprise or utilize cloud computing. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, wearable devices, and the like. The invention may also be practiced in distributed system environments where multiple computer systems (e.g., local and remote systems), which are linked through a network (either by hardwired data links, wireless data links, or by a combination of hardwired and wireless data links), perform tasks. In a distributed system environment, program modules may be located in local and/or remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Application-specific Standard Products (ASSPs), System-on-a-chip systems (SOCs), Complex Programmable Logic Devices (CPLDs), central processing units (CPUs), graphics processing units (GPUs), and/or others.

As used herein, the terms "executable module," "executable component," "component," "module," or "engine" can refer to hardware processing units or to software objects, routines, or methods that may be executed on one or more computer systems. The different components, modules, engines, and services described herein may be implemented as objects or processors that execute on one or more computer systems (e.g., as separate threads).

One will also appreciate how any feature or operation disclosed herein may be combined with any one or combination of the other features and operations disclosed herein. Additionally, the content or feature in any one of the figures may be combined or used in connection with any content or feature used in any of the other figures. In this regard, the content disclosed in any one figure is not mutually exclusive and instead may be combinable with the content from any of the other figures.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope

We claim:

1. An image sensor configured to capture imagery with mitigated noise, the image sensor comprising:
    a plurality of image sensing pixels arranged to form a sensor array, wherein:
        each image sensing pixel of the plurality of image sensing pixels comprises an active area configured to receive photons to facilitate image capture,
        each active area comprises a length and a width,
        for at least one image sensing pixel of the plurality of image sensing pixels, the length of the active area is smaller than about 80% of a pixel pitch measurement between the at least one image sensing pixel and an adjacent image sensing pixel, wherein a size of the active area relative to the pixel pitch measurement contributes to mitigating sensor noise for the image sensor, and the at least one image sensing pixel of the plurality of image sensing pixels further comprises a reflective component configured to extend an optical path length associated with an active region of the at least one image sensing pixel.

2. The image sensor of claim 1, wherein the width of the active area of the at least one image sensing pixel of the plurality of image sensing pixels is smaller than about 80% of the pixel pitch measurement between the at least one image sensing pixel and the adjacent image sensing pixel.

3. The image sensor of claim 1, wherein a depth of the active region associated with the active area of the at least one image sensing pixel of the plurality of image sensing pixels is smaller than about 80% of the pixel pitch measurement between the at least one image sensing pixel and the adjacent image sensing pixel.

4. The image sensor of claim 3, wherein the depth of the active region of the at least one image sensing pixel of the plurality of image sensing pixels is within a range of about 4 microns to about 6 microns.

5. The image sensor of claim 1, wherein the reflective component is positioned on a bottom portion of the active region of the at least one image sensing pixel of the plurality of image sensing pixels, the bottom portion being arranged opposite to a scene-facing top portion of the active region of the at least one image sensing pixel of the plurality of image sensing pixels.

6. The image sensor of claim 1, wherein the at least one image sensing pixel of the plurality of image sensing pixels further comprises a light scattering component configured to extend the optical path length associated with the active region of the at least one image sensing pixel of the plurality of image sensing pixels.

7. The image sensor of claim 6, wherein the light scattering component is positioned on a scene-facing top portion of the active region of the at least one image sensing pixel of the plurality of image sensing pixels.

8. The image sensor of claim 1, wherein the length or the width of the active area of the at least one image sensing pixel of the plurality of image sensing pixels is about 60% of the pixel pitch measurement between the at least one image sensing pixel and the adjacent image sensing pixel.

9. The image sensor of claim 1, wherein the adjacent image sensing pixel is arranged on a same row of the sensor array as the at least one image sensing pixel.

10. The image sensor of claim 1, wherein the adjacent image sensing pixel is arranged on a same column of the sensor array as the at least one image sensing pixel.

11. The image sensor of claim 1, wherein the length or the width of each active area of each image sensing pixel of the plurality of image sensing pixels is smaller than about 80% of the pixel pitch measurement.

12. The image sensor of claim 1, wherein the image sensor comprises a single photon avalanche diode sensor.

13. An image sensor configured to capture imagery with mitigated noise, the image sensor comprising:
a plurality of image sensing pixels arranged to form a sensor array, wherein:
each image sensing pixel of the plurality of image sensing pixels comprises an active area configured to receive photons to facilitate image capture,
each active area comprises a length and a width,
for at least one image sensing pixel of the plurality of image sensing pixels, the length or the width of the active area is smaller than about 80% of a pixel pitch measurement between the at least one image sensing pixel and an adjacent image sensing pixel, wherein a size of the active area relative to the pixel pitch measurement contributes to mitigating sensor noise for the image sensor, and the at least one image sensing pixel of the plurality of image sensing pixels further comprises a light scattering component configured to extend an optical path length associated with an active region of the at least one image sensing pixel, wherein a depth of the active region of the at least one image sensing pixel is smaller than about 80% of the pixel pitch measurement, and wherein the depth of the active region is within a range of about 4 microns to about 6 microns.

14. The image sensor of claim 13, wherein the length of the active area of the at least one image sensing pixel of the plurality of image sensing pixels is smaller than about 80% of the pixel pitch measurement between the at least one image sensing pixel and the adjacent image sensing pixel.

15. The image sensor of claim 13, wherein the width of the active area of the at least one image sensing pixel of the plurality of image sensing pixels is smaller than about 80% of the pixel pitch measurement between the at least one image sensing pixel and the adjacent image sensing pixel.

16. The image sensor of claim 13, wherein the at least one image sensing pixel of the plurality of image sensing pixels further comprises a reflective component configured to extend the optical path length associated with the active region of the at least one image sensing pixel of the plurality of image sensing pixels.

17. The image sensor of claim 16, wherein the reflective component is positioned on a bottom portion of the active region of the at least one image sensing pixel of the plurality of image sensing pixels, the bottom portion being arranged opposite to a scene-facing top portion of the active region of the at least one image sensing pixel of the plurality of image sensing pixels.

18. An image sensor configured to capture imagery with mitigated noise, the image sensor comprising:
a plurality of image sensing pixels arranged to form a sensor array, wherein:
each image sensing pixel of the plurality of image sensing pixels comprises an active area configured to receive photons to facilitate image capture,
each active area comprises a length and a width,
for at least one image sensing pixel of the plurality of image sensing pixels, the length or the width of the active area is smaller than about 80% of a pixel pitch measurement between the at least one image sensing pixel and an adjacent image sensing pixel, wherein a size of the active area relative to the pixel pitch measurement contributes to mitigating sensor noise for the image sensor, the at least one image sensing pixel of the plurality of image sensing pixels further comprises a reflective component configured to extend an optical path length associated with an active region of the at least one image sensing pixel, and the at least one image sensing pixel of the plurality of image sensing pixels further comprises a light scattering component configured to extend the optical path length associated with an active region of the at least one image sensing pixel, wherein a depth of the active region of the at least one image sensing pixel is smaller than about 80% of the pixel pitch measurement, and wherein the depth of the active region is within a range of about 4 microns to about 6 microns.

* * * * *